United States Patent
Hagino

(10) Patent No.: US 10,270,362 B2
(45) Date of Patent: Apr. 23, 2019

(54) RECTIFIER IC AND INSULATION TYPE SWITCHING POWER SUPPLY USING THE SAME

(71) Applicant: Rohm Co., Ltd., Kyoto (JP)

(72) Inventor: Junichi Hagino, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 15/791,548

(22) Filed: Oct. 24, 2017

(65) Prior Publication Data

US 2018/0123472 A1    May 3, 2018

(30) Foreign Application Priority Data

Oct. 27, 2016  (JP) ................. 2016-210962

(51) Int. Cl.
| | |
|---|---|
| *H02M 7/217* | (2006.01) |
| *H02M 1/14* | (2006.01) |
| *H02M 1/08* | (2006.01) |
| *H01L 23/495* | (2006.01) |
| *H02M 3/335* | (2006.01) |

(Continued)

(52) U.S. Cl.
CPC ........ *H02M 7/217* (2013.01); *H01L 23/3171* (2013.01); *H01L 23/4952* (2013.01); *H01L 23/49506* (2013.01); *H01L 23/49537* (2013.01); *H01L 23/49562* (2013.01); *H01L 23/49568* (2013.01); *H01L 23/49575* (2013.01); *H02M 1/08* (2013.01); *H02M 1/143* (2013.01); *H02M 3/33592* (2013.01); *H01L 2224/48137* (2013.01); *H01L 2224/48247* (2013.01); *H01L 2224/49111* (2013.01); *H01L 2224/49171* (2013.01); *H02M 3/33523* (2013.01); *H02M 2001/0048* (2013.01)

(58) Field of Classification Search
CPC combination set(s) only.
See application file for complete search history.

(56) References Cited

U.S. PATENT DOCUMENTS 4,373,019 A * 2/1983 Watanabe ............. H01L 21/705
                                                    257/E21.534
4,927,069 A * 5/1990 Ushikubo ................ B23K 1/00
                                                        228/123.1

(Continued)

FOREIGN PATENT DOCUMENTS

JP     2008-067443    3/2008

*Primary Examiner* — An T Luu
(74) *Attorney, Agent, or Firm* — Fish & Richardson P.C.

(57) ABSTRACT

A rectifier IC includes, in a single package, a transistor chip in which a transistor is integrated, a controller chip that detects a drain voltage (VD) and a source voltage (VS) of the transistor so as to perform ON/OFF control of the transistor, and functions as secondary side rectifier means of an insulation type switching power supply. The controller chip turns on the transistor when VD is lower than VS and turns off the transistor when VD is higher than VS. The insulation type switching power supply includes a transformer supplied with an input voltage, a control unit that controls primary side current of the transformer according to a feedback signal, a rectifying and a smoothing unit that rectifies and smooths a secondary side voltage of the transformer so as to generate an output voltage, and an output feedback unit that generates the feedback signal according to the output voltage.

6 Claims, 11 Drawing Sheets

(51) Int. Cl.
*H01L 23/31* (2006.01)
*H02M 1/00* (2006.01)

(56) References Cited

U.S. PATENT DOCUMENTS

| 8,816,497 B2* | 8/2014 | Wu | H03K 17/567 |
| | | | 257/499 |
| 9,093,434 B2* | 7/2015 | Kimura | H01L 23/3107 |
| 9,093,918 B2* | 7/2015 | Yang | H02M 1/4258 |
| 9,576,932 B2* | 2/2017 | Williams | H01L 24/97 |
| 2016/0049876 A1* | 2/2016 | Lee | H02M 3/33592 |
| | | | 363/20 |

\* cited by examiner

US 10,270,362 B2

RECTIFIER IC AND INSULATION TYPE SWITCHING POWER SUPPLY USING THE SAME

CROSS-REFERENCE TO RELATED APPLICATIONS

This nonprovisional application claims priority under 35 U.S.C. § 119(a) on Patent Application No. 2016-210962 filed in Japan on Oct. 27, 2016, the entire contents of which are hereby incorporated by reference.

BACKGROUND OF THE INVENTION

Field of the Invention

The invention disclosed in this specification relates to a rectifier IC and an insulation type switching power supply using the same.

Description of Related Art

Conventionally, insulation type switching power supplies are used in a wide variety of industries (such as automobile industry, industrial machinery industry, and household industry).

As an example of a conventional technique related to above, there is JP-A-2008-067443.

FIG. 10 is a circuit block diagram showing a first conventional example of an insulation type switching power supply. An insulation type switching power supply 100 of this conventional example can generate an output voltage Vo from an input voltage Vi so as to supply the same to a load Z while electrically insulating between a primary circuit system 100p (GND1 system) and a secondary circuit system 100s (GND2 system).

However, the insulation type switching power supply 100 of the first conventional example uses a diode 130 having a large forward drop voltage Vf as secondary side rectifier means, and hence there is room for further improvement in conversion efficiency thereof.

FIG. 11 is a circuit block diagram showing a second conventional example of the insulation type switching power supply. An insulation type switching power supply 200 of the second conventional example uses a rectifier transistor 231 having a small on-resistance instead of the above-mentioned diode 130 and a control IC 232 that performs ON/OFF control of the rectifier transistor 231, and hence it is possible to achieve higher conversion efficiency than the first conventional example.

However, in the insulation type switching power supply 200 of the second conventional example, a user must perform matching work between the rectifier transistor 231 and the controller IC 232 (such as adjusting work of gate resistance) every time when selecting the appropriate rectifier transistor 231 corresponding to a specification of application to which the switching power supply 200 is mounted. Therefore, there is room for further improvement in convenience thereof. In addition, compared with the first conventional example, there is a problem of increase in circuit area or cost because the number of components is increased.

SUMMARY OF THE INVENTION

In view of the above-mentioned problem found by the inventor, it is an object of the invention disclosed in this specification to provide a rectifier IC that can easily enhance conversion efficiency of the insulation type switching power supply.

For example, a rectifier IC disclosed in this specification include, in a single package, a transistor chip in which a transistor is integrated, and a controller chip that detects a first node voltage and a second node voltage of the transistor so as to perform ON/OFF control of the transistor, and functions as secondary side rectifier means of an insulation type switching power supply.

Note that other features, elements, steps, advantages, and characteristics of the present invention will become more apparent from the description of the best mode embodiment given below and the related attached drawings.

DETAILED DESCRIPTION OF THE PREFERRED EMBODIMENTS

<Insulation Type Switching Power Supply>

Figure 1:
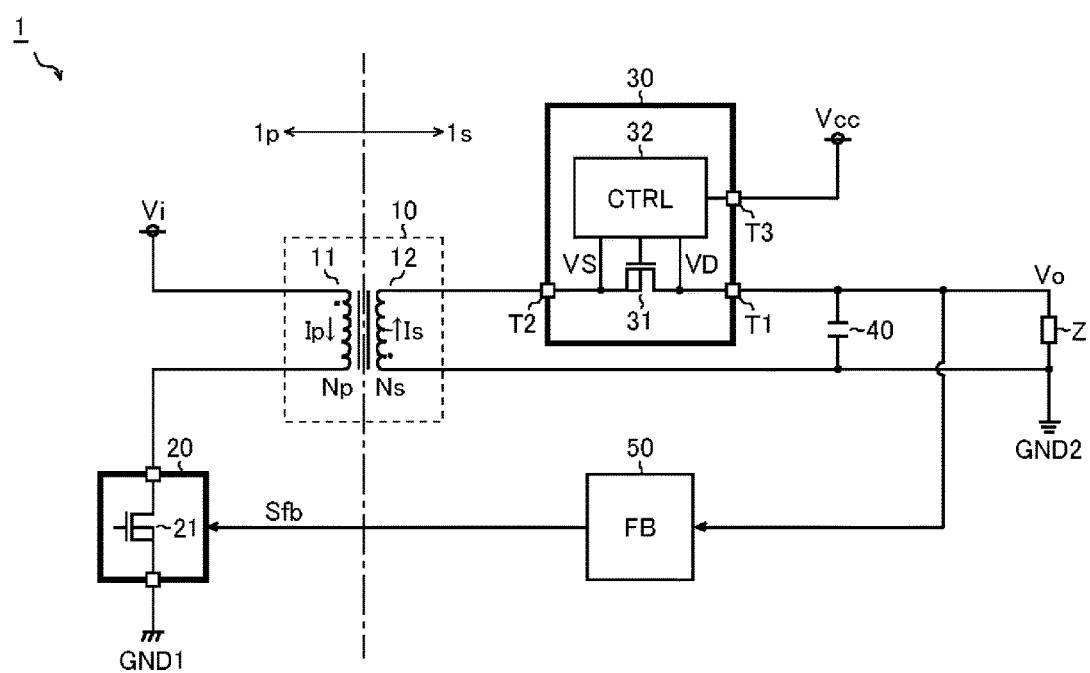
FIG. 1 is a circuit block diagram showing an overall structure of an insulation type switching power supply.

FIG. 1 is a block diagram showing an overall structure of an insulation type switching power supply. An insulation type switching power supply 1 of this diagram is a flyback type DC/DC converter, which generates an output voltage Vo from an input voltage Vi and supplies the same to a load Z while electrically insulating between a primary circuit system 1p (GND1 system) and a secondary circuit system 1s (GND2 system), and it includes a transformer 10, a power supply control IC 20, a rectifier IC 30, a smoothing capacitor 40, and an output feedback unit 50.

The transformer 10 includes a primary winding 11 (the number of turns Np) and a secondary winding 12 (the number of turns Ns), which are electromagnetically coupled in opposite polarity to each other while electrically insulating between the primary circuit system 1p and the secondary circuit system 1s. A first terminal of the primary winding 11 is connected to an application terminal of the input voltage Vi. A second terminal of the primary winding 11 is connected to a ground terminal GND1 of the primary circuit system 1p via an output transistor 21 (incorporated in the power supply control IC 20 in the example of this diagram). A first terminal of the secondary winding 12 is connected to an application terminal of the output voltage Vo (power supply terminal of the load Z) via the rectifier IC 30. A second terminal of the secondary winding 12 is connected to a ground terminal GND2 of the secondary circuit system 1s. The numbers of turns Np and Ns are arbitrarily adjusted so that a desired output voltage Vo is obtained. For example, when the number of turns Np is larger or when the number of turns Ns is smaller, the output voltage Vo becomes lower. On the contrary, when the number of turns Np is smaller or when the number of turns Ns is larger, the output voltage Vo becomes higher.

The power supply control IC 20 turns on and off the output transistor 21 in accordance with a feedback signal Sfb so as to control a primary side current Ip flowing in the primary winding 11 of the transformer 10. The output transistor 21 may be incorporated as an integrated device in the power supply control IC 20 or externally connected to the power supply control IC 20 as a discrete device. Note that an existing known method (such as a voltage mode control method, a current mode control method, or a hysteresis control method) can be used as the output feedback control by the power supply control IC 20, and detailed description thereof is omitted.

The rectifier IC 30 is a multichip type semiconductor integrated circuit device that functions as secondary side rectifier means of the insulation type switching power supply 1. Note that structure and operation of the rectifier IC 30 will be described later in detail.

The smoothing capacitor 40 is connected in parallel to the load Z and functions as secondary side smoothing means of the insulation type switching power supply 1.

In other words, the rectifier IC 30 and the smoothing capacitor 40 described above function as a rectifying and smoothing unit, which rectifies and smooths a secondary side voltage induced in the secondary winding 12 of the transformer 10 (i.e. a source voltage VS of the rectifier IC 30) so as to generate the output voltage Vo.

The output feedback unit 50 generates the feedback signal Sfb according to the output voltage Vo. Note that the output feedback unit 50 may have any circuit configuration, but it is general to adopt a configuration using a shunt regulator and a photo coupler, or a configuration using an auxiliary winding of the transformer 10.

In the insulation type switching power supply 1 of this structural example, when the output transistor 21 is turned on, the primary side current Ip flows from the application terminal of the input voltage Vi to the ground terminal GND1 via the primary winding 11 and the output transistor 21, and hence electric energy is stored in the primary winding 11. On the other hand, when the output transistor 21 is turned off, a secondary side voltage is induced in the secondary winding 12 that is electromagnetically coupled to the primary winding 11, and hence a secondary side current Is flows from the secondary winding 12 to the ground terminal GND2 via the rectifier IC 30. As a result, the smoothing capacitor 40 is charged so that the output voltage Vo is supplied to the load Z.

In this way, the insulation type switching power supply 1 of this structural example can generate the output voltage Vo from the input voltage Vi so as to supply the same to the load Z while electrically insulating between the primary circuit system 1p and the secondary circuit system 1s. Note that the flyback type is advantageous in cost reduction because it has a smaller number of components than a forward type that needs a smoothing inductor.

<Rectifier IC>

Continuously with reference to FIG. 1, the structure and operation of the rectifier IC 30 are described. The rectifier IC 30 of this structural example is a multichip type semiconductor integrated circuit device including a transistor chip 31 and a controller chip 32 sealed in a single package.

In addition, the rectifier IC 30 has at least external terminals T1 to T3 as means for electric connections with the outside of the IC. Outside the rectifier IC 30, the external terminal T1 (corresponding to the drain terminal) is connected to the application terminal of the output voltage Vo. The external terminal T2 (corresponding to the source terminal) is connected to the first terminal of the secondary winding 12 and also functions as the ground terminal (i.e., reference potential terminal) of the rectifier IC 30. The external terminal T3 (corresponding to the power supply terminal) is connected to an application terminal of a power supply voltage Vcc.

The transistor chip 31 is a semiconductor chip integrating the rectifier transistor (such as a vertical N-channel type double-diffused metal oxide semiconductor field effect transistor (NDMOSFET), as described later in detail), and can be regarded as the rectifier transistor itself. Accordingly, in the following description, the transistor chip 31 may be referred to as a "rectifier transistor 31". Note that the drain of the rectifier transistor 31 is connected to the external terminal T1 and a drain voltage detection pad of the controller chip 32. On the other hand, the source of the rectifier transistor 31 is connected to the external terminal T2 and a source voltage detection pad of the controller chip 32. In addition, the gate of the rectifier transistor 31 is connected to a gate control pad of the controller chip 32.

The controller chip 32 operates with the power supply voltage Vcc (>VS) supplied from the external terminal T3, and detects a drain voltage VD and the source voltage VS of the rectifier transistor 31 so as to perform ON/OFF control of the rectifier transistor 31. Specifically, the controller chip 32 performs gate control of the rectifier transistor 31 so as to turn on the rectifier transistor 31 when the drain voltage VD is lower than the source voltage VS (corresponding to a case where a diode 130 in FIG. 10 is in forward bias), and to turn off the rectifier transistor 31 when the drain voltage VD is higher than the source voltage VS (corresponding to a case where the diode 130 is in reverse bias).

Figure 10:
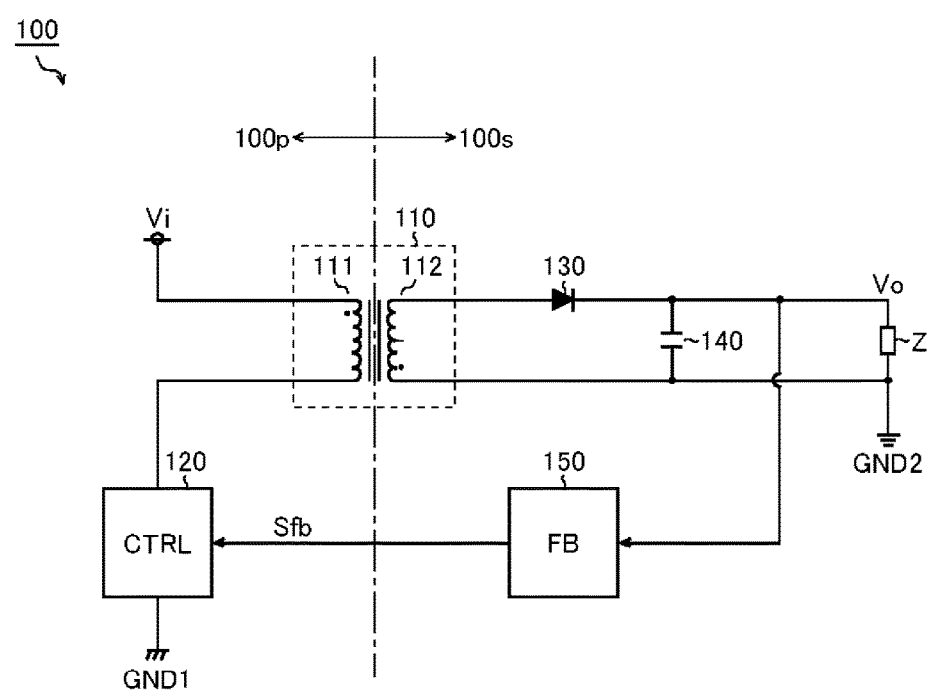
FIG. 10 is a circuit block diagram showing a first conventional example of the insulation type switching power supply.

In this way, because the rectifier transistor 31 having a small on-resistance is used as the secondary side rectifier means in the rectifier IC 30 of this structural example, it is possible to enhance the conversion efficiency of the insulation type switching power supply 1 to be higher than that in the conventional structure using a diode (FIG. 10).

In addition, the rectifier IC 30 of this structural example enables to perform matching work between the transistor chip 31 and the controller chip 32 (such as adjusting work of gate resistance) on a vendor side in advance. Therefore, all a user has to do is select the optimal rectifier IC 30 according to a specification of an application to which the insulation type switching power supply 1 is mounted, and hence excellent usability can be obtained.

Figure 11:
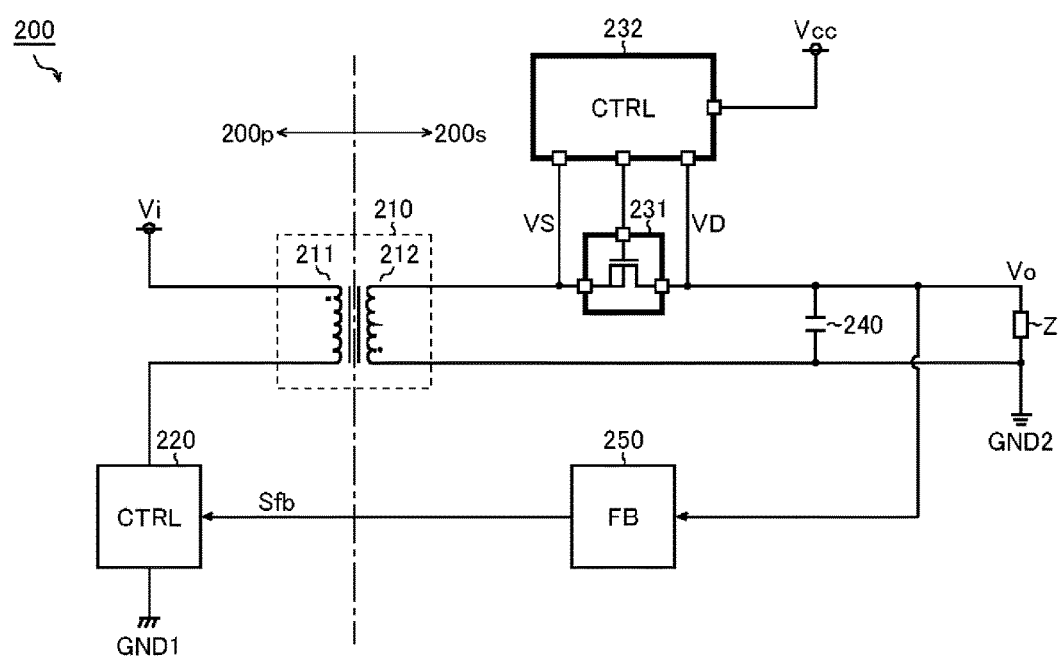
FIG. 11 is a circuit block diagram showing a second conventional example of the insulation type switching power supply.

In addition, the rectifier IC 30 of this structural example has a smaller number of components than the conventional structure (FIG. 11) using a discrete rectifier transistor and a controller IC, and hence it is also possible to achieve reduction in circuit area and cost.

<Transistor Chip>

Figure 2:
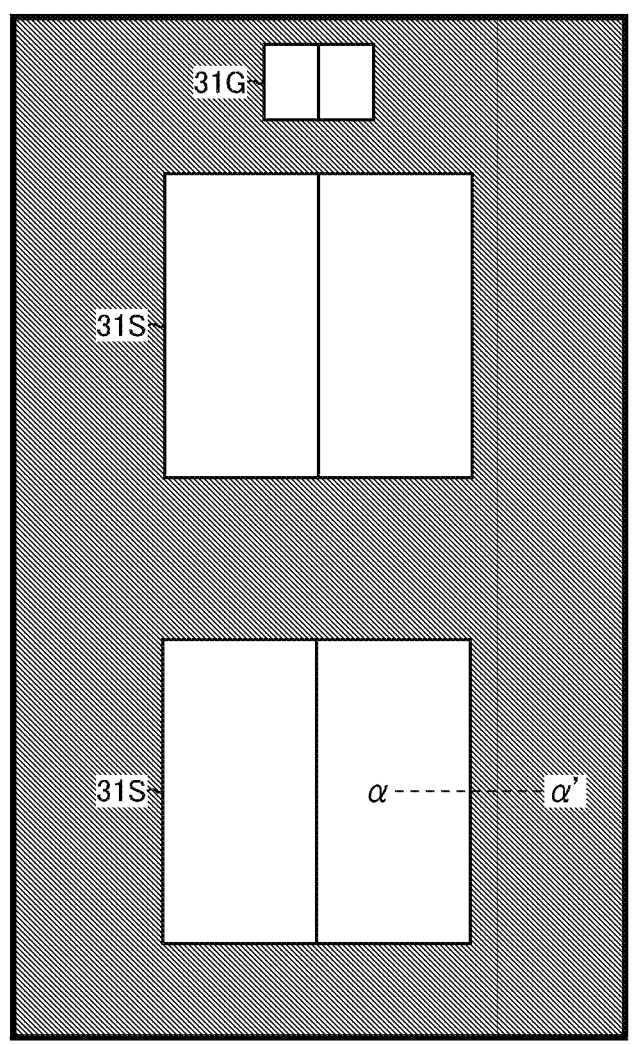
FIG. 2 is a plan view of a transistor chip.
Figure 3:
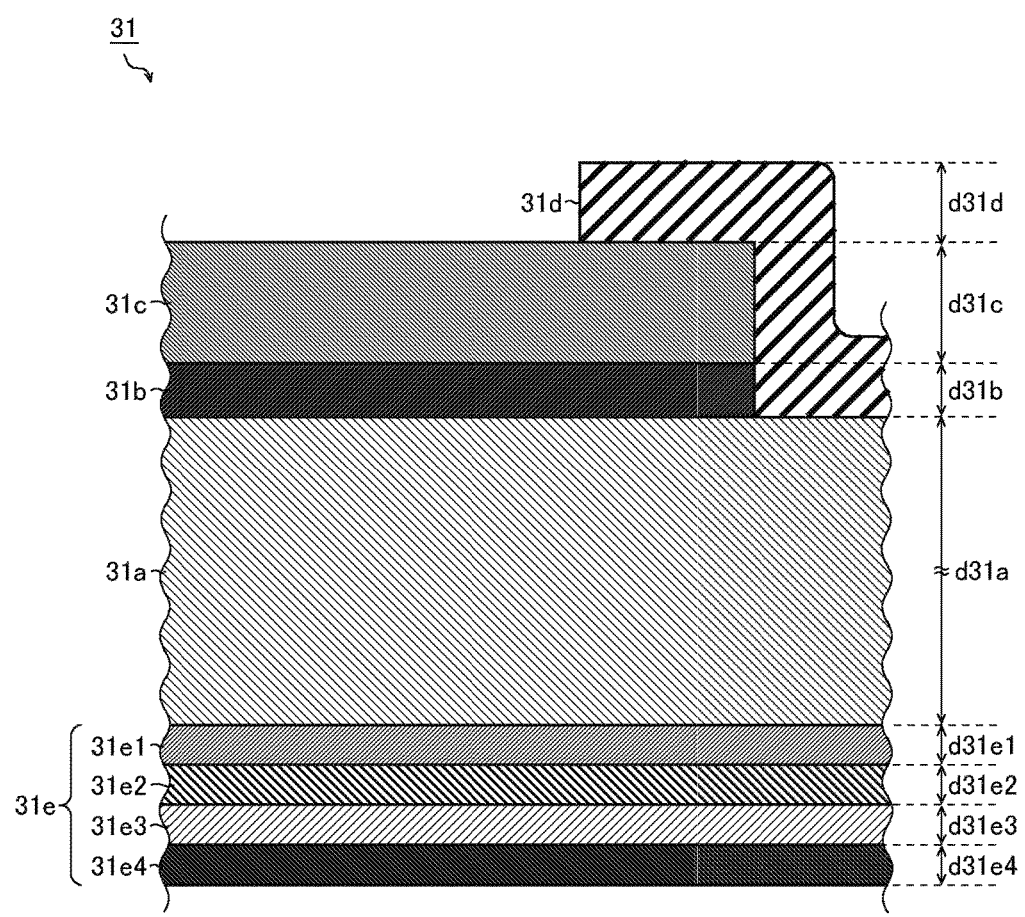
FIG. 3 is an α-α' cross-sectional view of the transistor chip.

FIGS. 2 and 3 are respectively a plan view and an α-α' cross-sectional view of the transistor chip 31. The rectifier transistor integrated in the transistor chip 31 (e.g. 3 mm by 3 mm including a scribe width of 90 μm) is a vertical NDMOSFET, and on its front side two source pads 31S (e.g. 2400 μm by 900 μm) and one gate pad 31G (e.g. 480 μm by 320 μm) are formed as shown in FIG. 2. Note that the number, size, and layout of each of the source pad 31S and the gate pad 31G can be appropriately adjusted according to current capacity, a process rule, and the like of the rectifier transistor.

In addition, as shown in FIG. 3, the transistor chip 31 includes a cell portion 31a (having thickness d31a of 270 μm, 150 μm or others) formed on its silicon substrate. The cell portion 31a includes a large number of unit cells, which are connected in parallel to form one rectifier transistor. Note that the structure of the unit cell may be a trench gate type or a planer gate type. In particular, the trench gate type enables to miniaturize the unit cell, and hence lower on-resistance of the rectifier transistor can be achieved.

On the surface of the cell portion 31a, an intermediate insulating layer 31b (e.g. $SiO_2$ layer) is formed to cover the gates of the unit cells.

On the surface of the intermediate insulating layer 31b, there formed a metal layer 31c (corresponding to the source pads 31S having thickness d31c of 4.2 μm) having a rectangular shape in a plan view. Note that as a material of the metal layer 31c, AlCu alloy can be appropriately used, for example.

At peripheries of the intermediate insulating layer 31b and the metal layer 31c, there formed a protection layer 31d (having thickness d31d of 1.6 μm) so as to cover a surface outer circumferential edge of the metal layer 31c. In other words, the protection layer 31d covers the surface of the transistor chip 31 so that the source pads 31S (and the gate pad 31G) are exposed in a plan view of the transistor chip 31 (see the hatched area in FIG. 2). Note that SiN can be appropriately used as material of the protection layer 31d, for example.

On the other hand, a drain electrode 31e is formed as solid wiring on the back surface of the cell portion 31a. Note that the drain electrode 31e has a laminated structure in which a Ti layer 31e1, a Ni layer 31e2, an Au layer 31e3, and an Ag layer 31e4 are laminated in order from the cell portion 31a side, and the Ag layer 31e4 as the outermost layer is die bonded to a lead frame using silver paste or solder. Note that thicknesses d31e1 to d31e4 of the layers are 70, 600, 70, and 300 nm, for example.

<Lead Frame>

Figure 4:
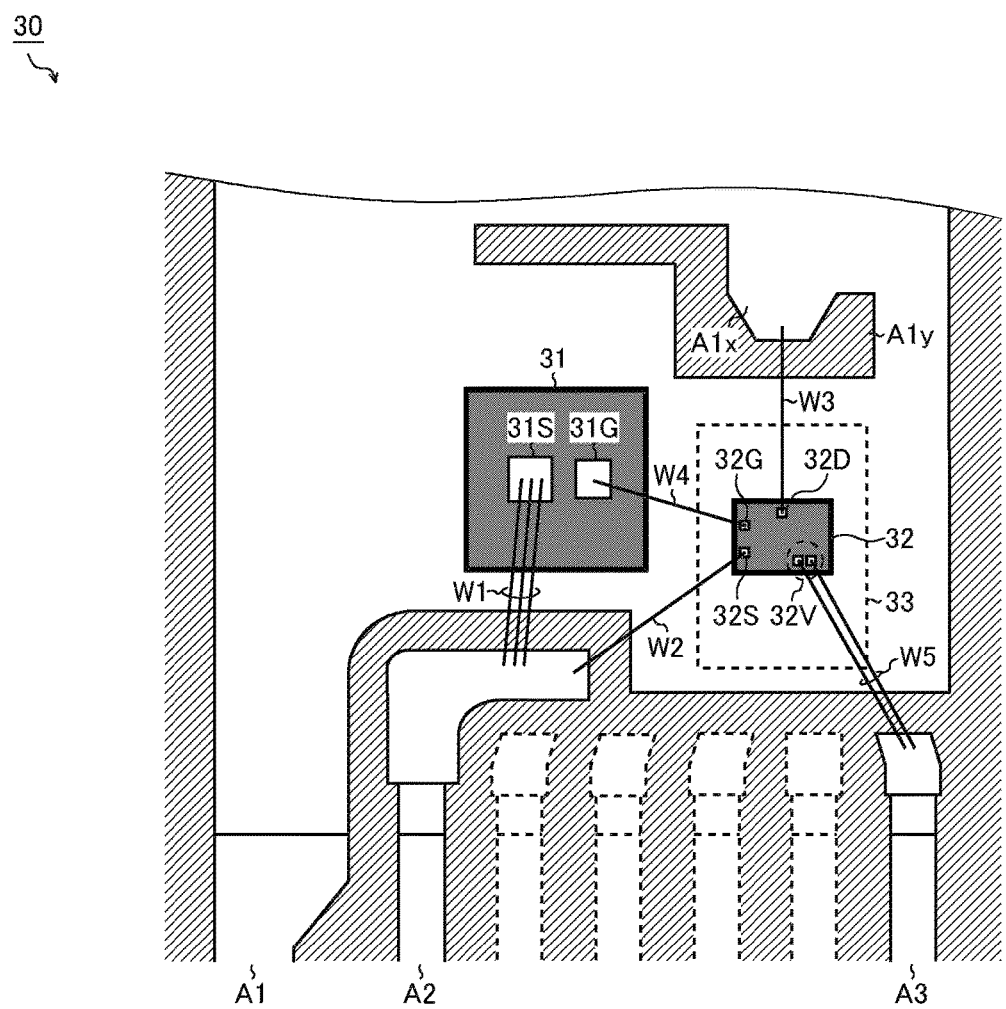
FIG. 4 is a diagram of a lead frame pattern.

FIG. 4 is a diagram of a lead frame pattern of the rectifier IC 30 (an example of adopting a TO220 package). As shown in this diagram, the rectifier IC 30 has lead frames A1 to A3. The lead frames A1 to A3 extend in one direction from one end surface of the package as the external terminals T1 to T3, respectively. Note that lead frames may be added as shown by broken lines in the diagram in order to add functions to the rectifier IC 30.

The back surface (i.e. the drain electrode) of the transistor chip 31 is die bonded to the lead frame A1. Note that it is desirable to pattern the lead frame A1 so as to have as large area as possible within the package area. With this structure, heat generated in the transistor chip 31 can be effectively dissipated.

On the other hand, the controller chip 32 is mounted on the lead frame A1 via an insulating member 33. With this structure, the controller chip 32 can be mounted on the lead frame A1 while electrically insulating between the lead frame A1 and the controller chip 32.

Note that if the transistor chip 31 and the controller chip 32 are mounted on separate lead frames, heat and noise hardly propagate from the transistor chip 31 to the controller chip 32. However, in order to separate the lead frames, an area of the lead frame A1 to which the transistor chip 31 is mounted must be reduced, and hence heat dissipation performance is sacrificed.

On the other hand, with the structure of this diagram, it is not necessary to reduce the area of the lead frame A1, and hence the heat dissipation performance is not sacrificed.

Note that also when an additional chip is mounted on the rectifier IC 30, it is preferred to mount the additional chip on the lead frame A1 via the insulating member 33 similarly to the above description.

One or more wires W1 to W5 are respectively laid between the source pad 31S of the transistor chip 31 and the lead frame A2, between a source voltage detection pad 32S of the controller chip 32 and the lead frame A2, between a drain voltage detection pad 32D of the controller chip 32 and the lead frame A1, between a gate control pad 32G of the controller chip 32 and the gate pad 31G of the transistor chip 31, and between a power supply pad 32V of the controller chip 32 and the lead frame A3. Note that Cu or Al should be used as material of the wires W1 to W5.

In addition, the lead frame A1 is provided with an isolation groove A1y formed to isolate between the insulating member 33 and a wire bonding area A1x (i.e., an area to which one end of the wire W3 is bonded). The isolation groove A1y should be formed in a U shape, for example, so as to surround the wire bonding area A1x. With this structure, the wire bonding area A1x of the lead frame A1 becomes quite conspicuous, and hence it is easy to check a bonded state of the wire W3.

In addition, even if adhesive (insulation paste B1 described later) with which the insulating member 33 is attached to the lead frame A1 escapes to the periphery of the insulating member 33, there is no risk that the adhesive moves over the isolation groove A1y and reaches the wire bonding area A1x. Therefore, it is possible to avoid bonding failure of the wire W3 in advance.

<Mounting Process>

Figure 5:
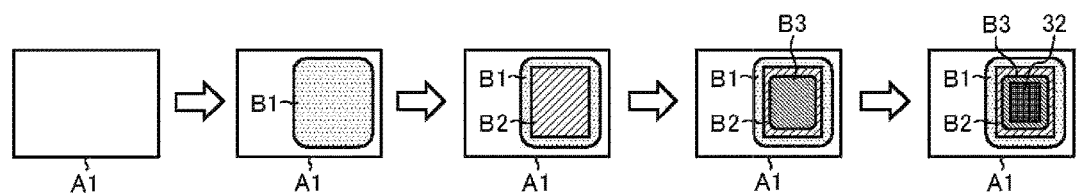
FIG. 5 is a process chart of mounting a controller chip.

FIG. 5 is a process chart when the controller chip 32 is mounted to the lead frame A1, and the mounting process sequentially proceeds from the left side to the right side of the chart.

First, in a first step, the insulation paste B1 (e.g. silicon paste) is applied to the surface of the lead frame A1.

Next in a second step, a ceramic insulating substrate B2 (e.g. alumina insulating substrate) is placed on the insulation paste B1. In other words, the ceramic insulating substrate B2 is pasted to the lead frame A1 with the insulation paste B1. Note that the ceramic insulating substrate B2 in this chart corresponds to the insulating member 33 in FIG. 4.

Next, in the third step, conductive paste B3 (e.g. silver paste) is applied to the surface of the ceramic insulating substrate B2.

Finally in a fourth step, the controller chip 32 is placed on the conductive paste B3. In other words, the controller chip 32 is pasted to ceramic insulating substrate B2 with the conductive paste B3.

With the process described above, the controller chip 32 can be mounted on the lead frame A1 while electrically insulating between the lead frame A1 and the controller chip 32.

<Package>

Note that as a package of the rectifier IC 30, it is possible to use an insertion mounting type package (such as a zigzag in-line package (ZIP), a single line package (SIP), or a transistor outline (TO) package), or a surface mounting type package (such as a small outline non-leaded (SON) package or a quad flat non-leaded (QFN) package).

Figure 6:
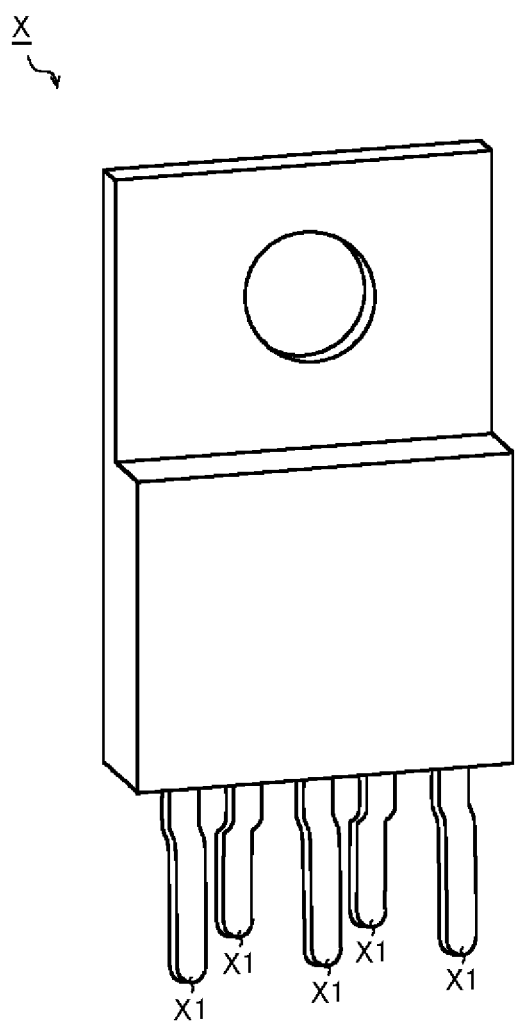
FIG. 6 is a front side perspective view of a ZIP package.
Figure 7:
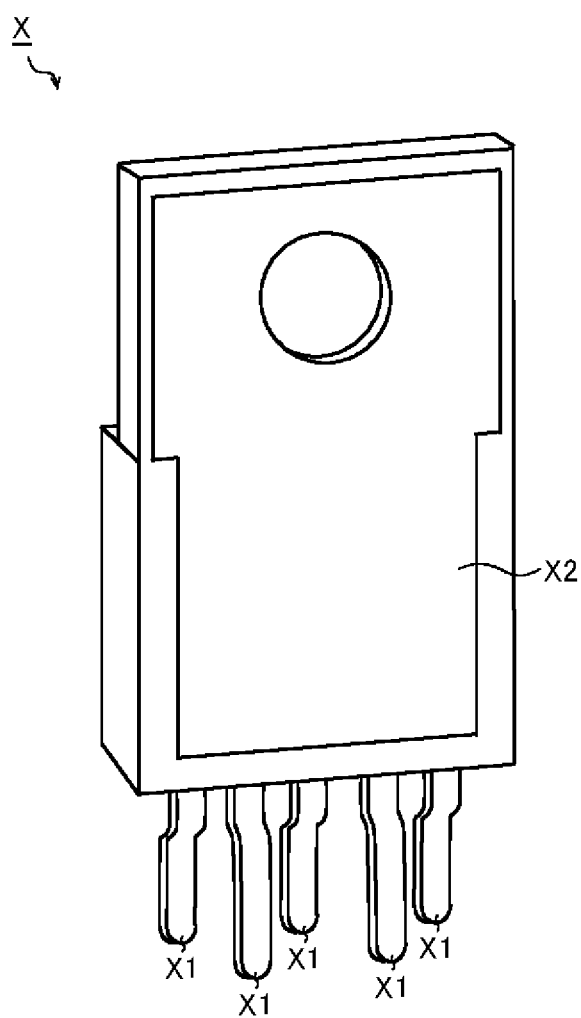
FIG. 7 is a rear side perspective view of the ZIP package.

FIGS. 6 and 7 are respectively a front side perspective view and a rear side perspective view of the ZIP package. The ZIP package X has a plurality of (five in these views) lead pins X1, which extend in one direction from one end surface thereof and are bent in a zig-zag arrangement.

Figure 8:
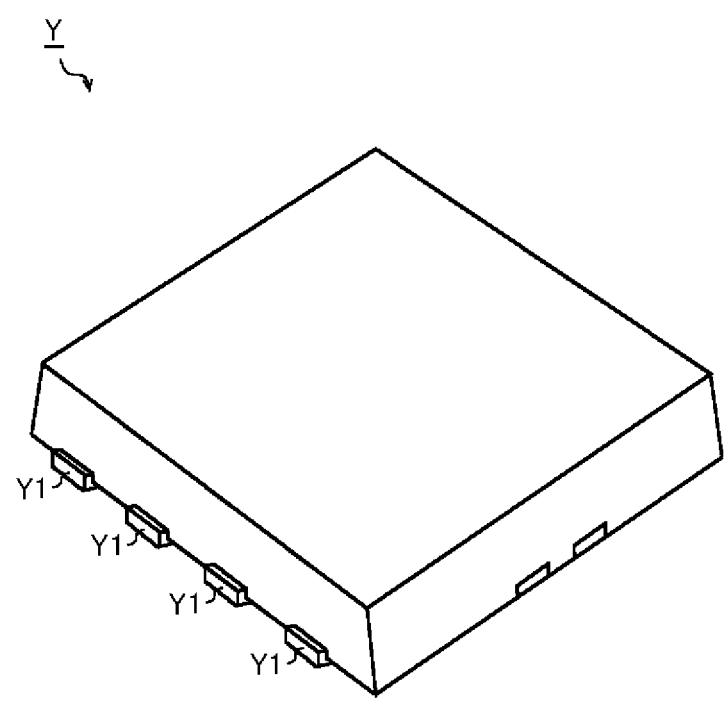
FIG. 8 is a front side perspective view of a SON package.
Figure 9:
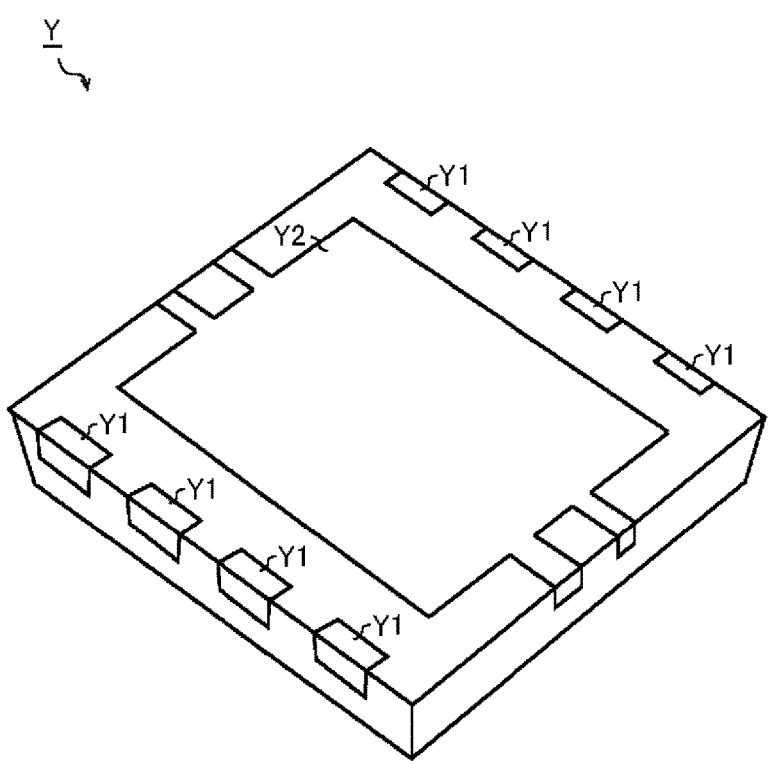
FIG. 9 is a rear side perspective view of the SON package.

FIGS. 8 and 9 are respectively a front side perspective view and a rear side perspective view of the SON package. The SON package Y has a plurality of (eight in these views) electrode pads Y1 arranged along two sides of the bottom surface.

In case of adopting either one of packages described above, at least a part of the lead frame A1 to which the transistor chip 31 is mounted (see FIG. 4) should be exposed from the package as a heat dissipation pad X2 or Y2. With this structure, heat dissipation of the transistor chip 31 can be enhanced, and hence thermal breakdown or thermal runaway of the rectifier IC 30 hardly occurs.

As a matter of course, the rectifier transistor 31 has a smaller on-resistance and a smaller power loss than the conventional structure using a rectifier diode, as described above. Therefore, depending on the current flowing in the transistor chip 31, heat generation in the transistor chip 31 is not a substantial problem, and there may be a case where it is not necessary to expose the lead frame A1 from the package so as to enhance heat dissipation effect. In this case, a normal small outline package package (SOP), a TO220 package with full molding, or the like can be used, for example.

<Other Variations>

Other than the embodiment described above, the various technical features disclosed in this specification can be variously modified within the scope of the technical invention without deviating from the spirit thereof. In other words, the embodiment described above is merely an example in every aspect and should not be interpreted as a limitation. The technical scope of the present invention should be defined not by the above description of the embodiment but by the claims, and should be understood to include all modifications within meanings and scopes equivalent to the claims.

INDUSTRIAL APPLICABILITY

The invention disclosed in this specification can be applied to insulation type switching power supplies that are used in all fields (such as automobile industry, industrial machinery industry, and household industry).

What is claimed is:

1. A rectifier IC working as secondary side rectifier means of an insulation type switching power supply, the rectifier IC comprising in a single package:
   a transistor chip in which a transistor is integrated; and
   a controller chip arranged to detect a first node voltage and a second node voltage of the transistor so as to perform ON/OFF control of the transistor, wherein the transistor is a vertical N-channel type double-diffused metal oxide semiconductor field effect transistor (NDMOSFET), wherein
   the transistor chip is die bonded to the first lead frame, and
   the controller chip is mounted on the first lead frame via an insulating member, wherein one or more wires are respectively laid between a source pad of the transistor chip and a second lead frame, between a source voltage detection pad of the controller chip and the second lead frame, between a drain voltage detection pad of the controller chip and the first lead frame, between a gate control pad of the controller chip and a gate pad of the transistor chip, and between a power supply pad of the controller chip and a third lead frame, wherein the first lead frame is provided with an isolation groove arranged to isolate between the insulating member and a wire bonding area.

2. The rectifier IC according to claim 1, wherein the controller chip turns on the transistor when the first node voltage is lower than the second node voltage and turns off the transistor when the first node voltage is higher than the second node voltage.

3. The rectifier IC according to claim 1, wherein the insulating member is insulation paste applied to the lead frame.

4. The rectifier IC according to claim 1, wherein the insulating member is a ceramic insulating substrate.

5. The rectifier IC according to claim 1, wherein at least a part of the first lead frame is exposed as a heat dissipation pad.

6. An insulation type switching power supply comprising:
   a transformer supplied with an input voltage;
   a control unit arranged to control primary side current of the transformer according to a feedback signal;
   a rectifying and smoothing unit arranged to rectify and smooth a secondary side voltage of the transformer so as to generate an output voltage; and
   an output feedback unit arranged to generate the feedback signal according to the output voltage, wherein
   the rectifying and smoothing unit includes the rectifier IC according to the claim 1 as secondary side rectifier means.

* * * * *